United States Patent
Soh

(10) Patent No.: US 6,716,657 B1
(45) Date of Patent: Apr. 6, 2004

(54) METHOD FOR INTERCONNECTING ARRAYS OF MICROMECHANICAL DEVICES

(75) Inventor: Hyongsok Soh, Basking Ridge, NJ (US)

(73) Assignee: Agere Systems Inc, Allentown, PA (US)

( * ) Notice: Subject to any disclaimer, the term of this patent is extended or adjusted under 35 U.S.C. 154(b) by 0 days.

(21) Appl. No.: 09/578,894

(22) Filed: May 26, 2000

(51) Int. Cl.[7] .............................................. H01L 21/00
(52) U.S. Cl. ........................ 438/29; 438/611; 438/675; 438/800
(58) Field of Search ................................ 438/667, 668, 438/611, 674, 29, 27, 31, 65, 108, 618, 800; 385/16.17, 18, 19, 20, 21, 22, 23, 24

(56) References Cited

U.S. PATENT DOCUMENTS

| | | | | |
|---|---|---|---|---|
| 4,394,712 A | * | 7/1983 | Anthony ..................... 361/411 |
| 4,960,177 A | * | 10/1990 | Holm-Kennedy et al. .. 177/210 |
| 4,979,149 A | * | 12/1990 | Popovic et al. ............. 364/244 |
| 5,401,983 A | * | 3/1995 | Jokerst et al. ................. 257/82 |
| 5,424,245 A | * | 6/1995 | Gurtler et al. ............... 437/183 |
| 5,529,950 A | * | 6/1996 | Hoenlein et al. ............ 437/170 |
| 5,587,119 A | * | 12/1996 | White ......................... 264/104 |
| 5,646,067 A | * | 7/1997 | Gaul ........................... 437/180 |
| 5,682,062 A | * | 10/1997 | Gaul ........................... 257/686 |
| 5,717,247 A | * | 2/1998 | Koh et al. ................... 257/686 |
| 5,981,350 A | * | 11/1999 | Geusic et al. ............... 438/386 |
| 6,090,636 A | * | 7/2000 | Geusic et al. ................. 438/31 |
| 6,143,616 A | * | 11/2000 | Geusic et al. ............... 438/389 |
| 6,150,188 A | * | 11/2000 | Geusic et al. ................. 438/31 |
| 6,181,460 B1 | * | 1/2001 | Tran et al. ................... 359/291 |
| 6,187,677 B1 | * | 2/2001 | Ahn ............................ 438/667 |
| 6,221,769 B1 | * | 4/2001 | Dhong et al. ............... 438/667 |
| 6,342,430 B1 | * | 1/2002 | Adams et al. .............. 438/424 |
| 6,344,672 B2 | * | 2/2002 | Huffman ..................... 257/296 |

* cited by examiner

*Primary Examiner*—George Fourson
*Assistant Examiner*—Fernando Toledo
(74) *Attorney, Agent, or Firm*—Peter V. D. Wilde

(57) ABSTRACT

The specification describes interconnection techniques for interconnecting large arrays of micromechanical devices on a silicon platform. The problem of interconnection congestion is overcome by routing the interconnections through the substrate. The through interconnections are made by etching vias through the substrate by RIE, oxidizing the via sidewalls, and filling the vias with polysilicon.

4 Claims, 10 Drawing Sheets

METHOD FOR INTERCONNECTING ARRAYS OF MICROMECHANICAL DEVICES

FIELD OF THE INVENTION

This invention relates to electronic assembly technology and more specifically to interconnections on semiconductor wafers.

BACKGROUND OF THE INVENTION

A sophisticated and widely used interconnection technology has been developed for connecting one electrical site on a semiconductor wafer to another. Typically these interconnections involve connecting the active elements of a semiconductor device, e.g. source, drain, gate to each other, or to another device, or to a runner that interconnects to another level. In early device technology, and in some simple large area devices in current production, these interconnections are made on a single level on the surface of the semiconductor wafer. As device dimensions have been reduced, and the complexity of interconnections increased, multiple level interconnections were developed. These are stacked on the semiconductor wafer surface over the active devices. Three or even four levels of interconnection are not uncommon.

Recently, new technologies have arisen where one or more interconnect levels are formed directly on the semiconductor surface, and active device located above the interconnect levels. However, in both of these cases all of the device structure, including the interconnections, are located on the same side of the wafer.

New photonic devices are in development that use micromechanical elements. In principal micromechanical elements can be built on a variety of platforms, not necessarily semiconductor platforms. However, highly and often elegantly engineered silicon processing can be used to make new device structures that combine mainly the mechanical and optical properties of silicon. Consequently, so-called silicon optical bench technology has evolved in which the platform for the micromechanical devices or subassemblies is a silicon wafer, or a large silicon chip.

Among the most promising of the photonic micromechanical devices are optical switches. These devices typically comprise mirrors, and the mirrors operate as moving parts. The movement of the mirrors in these devices may be effected by magnetic or electric fields, both activated using electrical circuitry. To date, the electrical circuits have been built around the micromechanical elements to interconnect them together. As the micromechanical elements shrink in size, and the electrical circuits that drive them become more complex, the option of building interconnect layers on top of the active structures, as in state of the art IC technology, is limited by both the need for movement of the micromechanical elements and the need for accessing these elements, e.g., mirrors, with optical beams. The solution to interconnect congestion in large micro-mirror arrays to date has been to increase the platform area.

SUMMARY OF THE INVENTION

We have developed an interconnect technology for micromechanical devices in which the micromechanical elements are located on the top side of the silicon wafer platform but most of the interconnection for the electrical circuits that drive the micromechanical elements is located on the backside, i.e. bottom side, of the silicon wafer. This interconnect strategy leads to several important advantages. It provides more area for interconnections. It allows for multilevel interconnect layers. It provides space, with concomitant short interconnections, for attachment of active drive IC devices. It removes a source of stray electromagnetic fields from the top surface, where the electrostatic drive elements for mirror tilt are susceptible to unwanted interactions, to the bottom surface remote from the mirror tilt apparatus. According to the invention, the interconnections are made using through holes that extend from the front side of the silicon wafer to the backside through the thickness of the silicon wafer. The walls of the through holes are first coated with insulator, and the remaining hole is plugged with a conductive material, preferably polysilicon. The choice of polysilicon is advantageous for thermo-mechanical integrity of the wafer.

DETAILED DESCRIPTION

Figure 1:
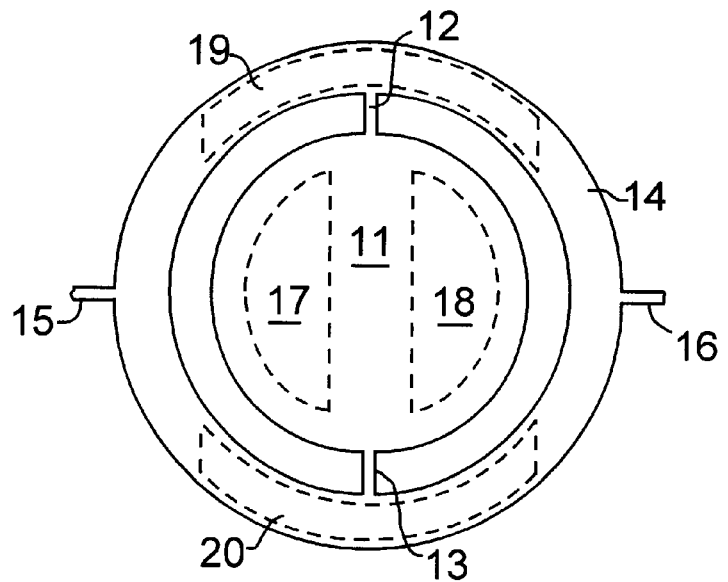
FIG. 1 is a schematic view of a micromechanical subassembly, in this embodiment a mirror with four way tilt for an optical cross connect, that is adapted for the interconnection system of the invention.

Referring to FIG. 1, a micromechanical mirror with four way tilt capability comprises mirror surface 11, flexibly suspended from support arms 12 and 13. The support arms are attached to gimbal ring 14, which in turn is flexibly suspended by support arms 15 and 16 from a fixed support (not shown). The drive electrodes for this device are shown in phantom. The electrodes controlling two way tilt for mirror 11 are shown at 17 and 18, and the electrodes for controlling two way tilt for gimbal ring 14 are shown at 19 and 20. The two way tilt capability for the mirror and the two way tilt capability for the gimbal combine to produce four way tilt capability for the mirror. Control of the tilt is effected electrostatically by application of voltages selectively to electrodes 17–20. This normally requires that each of the four electrodes be independently addressable. An array of n devices, requires 4n independent electrical interconnections. In principle, fewer electrical connections can be used but the preferred choice is that shown.

In an optical cross connect, the mirrors in the array communicate with optical waveguides. These waveguides, and the overall system architecture, are not part of the invention and for simplicity in presenting the invention are not shown. However, it is well known that optical cross connects in the form of mirror arrays require compact mirror arrays, i.e., close packing of the mirrors, for efficient design of the overall system.

Figure 2:
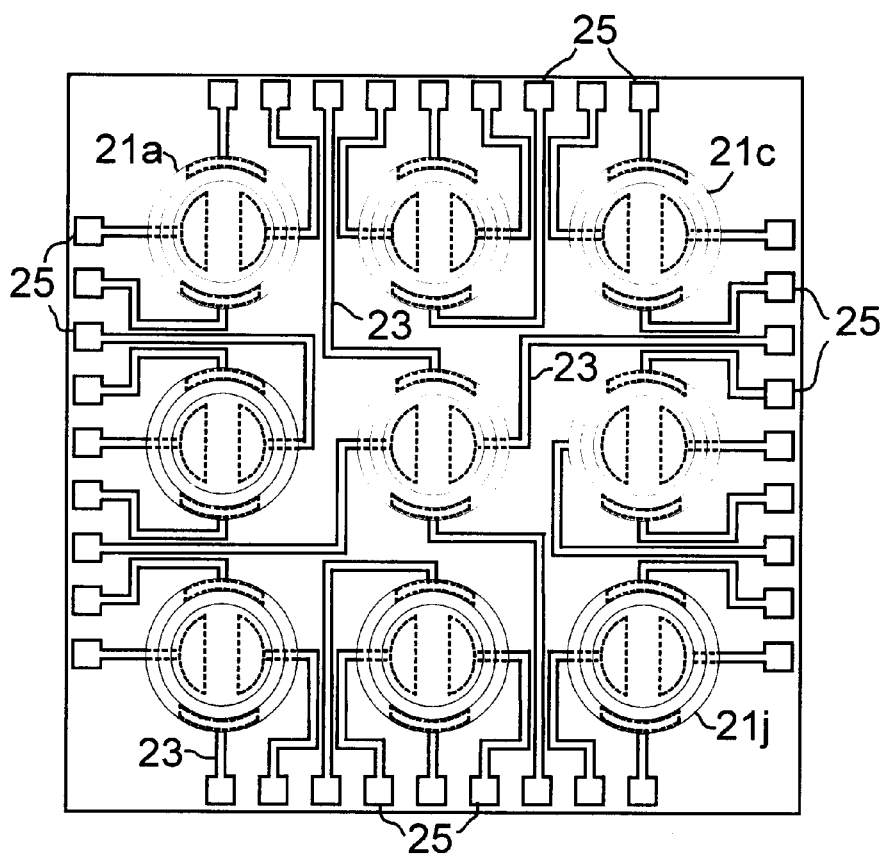
FIG. 2 is a schematic representation of a silicon wafer platform with micro-mechanical elements and interconnect circuits located on the same side of the silicon wafer.

An array of 3×3 micromechanical devices of FIG. 1 is shown in FIG. 2. The nine micromechanical mirrors are shown as 21a–21j. Runners 23 interconnect the four electrodes for each device 21a–21j to bond pads 25. This interconnection requires a total of 36 individual runners and bond pads for the 3×3 array.

The size, 3×3, of the array is chosen here for convenience in illustrating the interconnection implications of large micromechanical device arrays. Device arrays in current development may be much larger, e.g. hundreds or even thousands of micromechanical devices on a single silicon platform. As the number of micromechanical devices is multiplied, the required interconnect area for a given runner pitch increases dramatically, and the size of the substrate platform needed to accommodate the interconnections quickly becomes prohibitive. Moreover, the spacing between the mirror elements must be enlarged significantly, as can be inferred from FIG. 2, to allow space for the electrode interconnections. In the relatively small array shown, the space between micromechanical mirror devices accommodates three runners. In a corresponding 10×10 array, the space between micromechanical mirror devices at the edge of the array would be increased to accommodate ten runners. For some state of the art applications, hundreds, or even thousands, of devices are needed in a single array.

The micromechanical mirror device is given by way of example only of a wide variety of electrically driven micromechanical elements that may be fabricated in large arrays on a common substrate. It is presented for illustration of the problems associated with electrically interconnecting large micromechanical device arrays for which mechanical movement and optical access is incompatible with traditional multilevel printed circuit interconnection approaches. Other micromechanical devices may require fewer or more interconnections. It is evident that for large arrays of micromechanical devices, an improved interconnection arrangement is needed.

Figure 3:
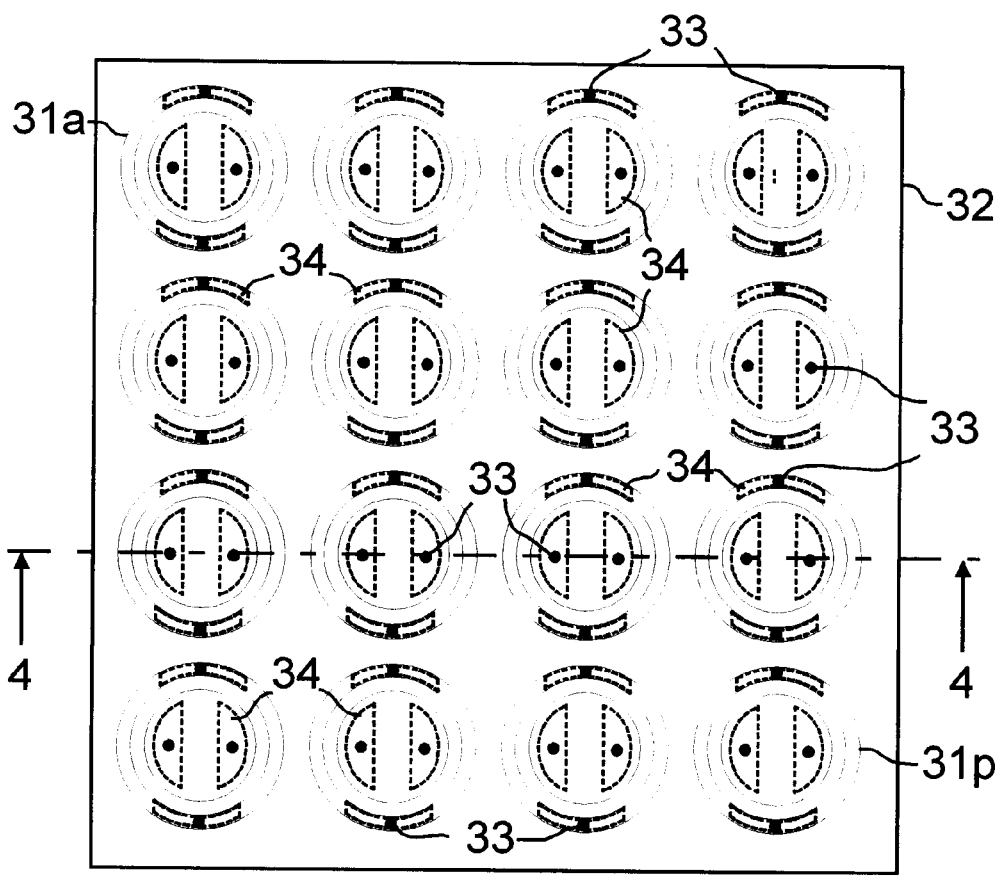
FIG. 3 is a schematic representation similar to that of FIG. 2 showing removal of the micromechanical drive circuit interconnection to the backside of the silicon wafer in accordance with a principle feature of the invention.

The solution to the interconnection problem according to this invention is illustrated in FIGS. 3–6. With reference to FIG. 3, here the micromechanical mirror devices, 31a–31p, are close packed in a 4×4 array on substrate 32. The substrate is the same size as the substrate used for the 3×3 array of FIG. 2. The more efficient packing arrangement is made possible by routing the interconnections through the silicon substrate. The electrode interconnections that extend through substrate 32 are shown at 33. Electrostatic drive electrodes are shown at 34.

Figure 4:
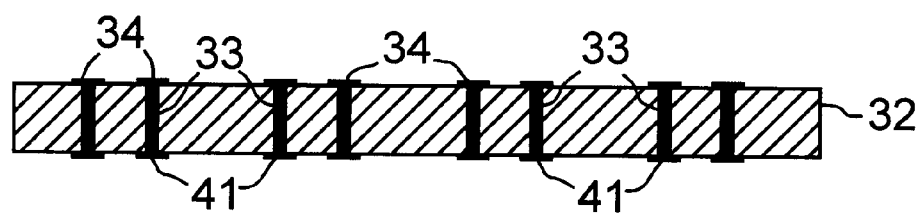
FIG. 4 is a section view through 4—4 of FIG. 3.

The interconnections 33 that extend through the substrate 32 can be seen in FIG. 4, which is section 4—4 of FIG. 3. For the purposes of exposition these openings through the substrate, which are a vitalizing feature of the invention, may be referred to as through hole interconnections, or vias. The electrostatic drive electrodes are shown at 34. The backside interconnection pads can be seen in FIG. 4 and are designated 41.

Figure 5:
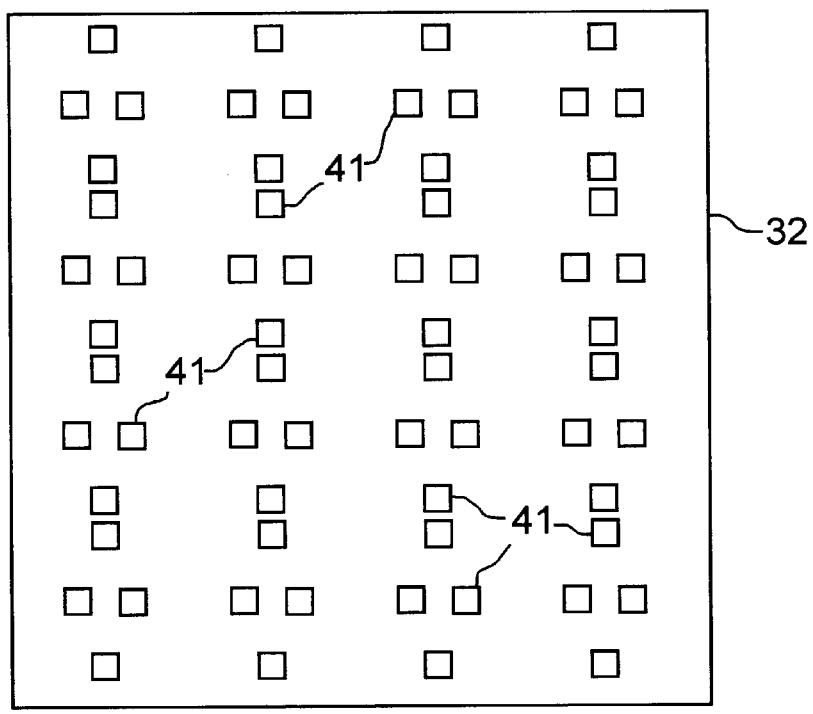
FIG. 5 is a view of the bottom side of the substrate shown in FIGS. 3 and 4.

The bottom side of substrate 32 is shown in plan view in FIG. 5. The array of contact pads designated 41 are formed on the bottom surface of substrate 32 and correspond in position with the bottom of the vias.

Figure 6:
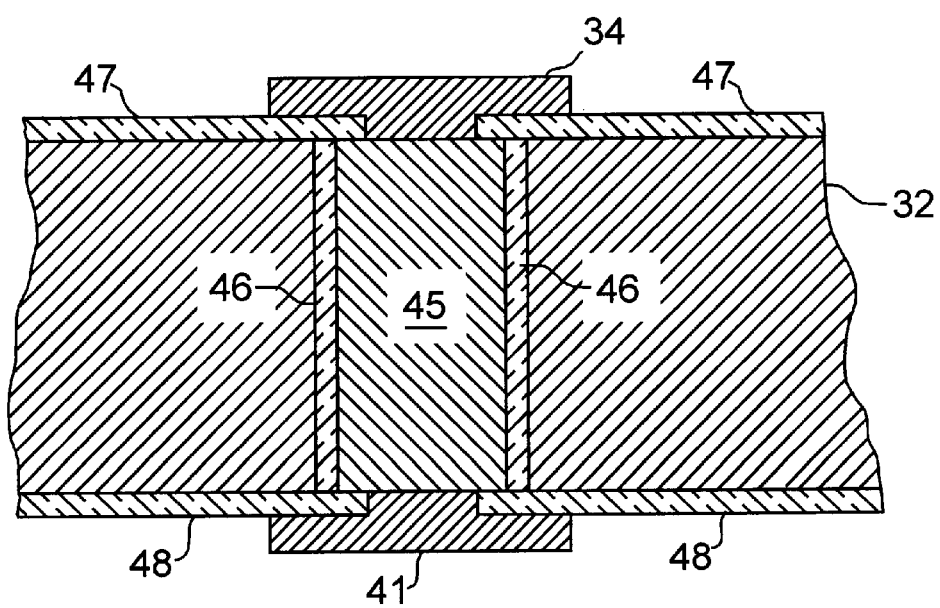
FIG. 6 is a cross section showing one of the vias of FIGS. 3 and 4 in more detail.

The interconnections, or vias, that extend through the micromechanical device substrate 32 are illustrated in the section view of FIG. 6, which shows one of these vias in more detail. An electrostatic drive electrode is shown at 34 and the micromechanical device substrate is designated 32 as before. The interconnection through substrate 32 is represented by conductive plug 45. The conductive plug 45 is insulated from the substrate 32 by insulating layer 46. The top and bottom surfaces of the substrate 32 also have insulating layers 47 and 48 respectively. Conductor pads 41 are shown on the bottom side of the substrate. A suitable technique for fabricating this structure will be described below.

It should be evident to those skilled in the art that the size of the various elements in these figures, e.g. the runners and bond pads of FIG. 3, are for convenience in illustrating the principles of the invention and are not necessarily to scale. The 3×3, and 4×4, arrays are shown for convenience in exposition. A more typical array, as suggested above, is 32×32 micromechanical devices on a 3.2 cm substrate, which allows an approximate single device size of 1 mm$^2$. Also, the array configuration, with x- and y- rows, is by way of example only. Other arrangements, e.g. with alternate rows offset and rows interleaved, may also be used.

The backside of substrate 32, as shown in FIG. 5, has an area array of bond pads 41 arranged for interconnection. Several options are available for interconnecting to sites 41. A standard single level printed circuit may be used as in FIG. 2. Multi-level interconnections can be used to allow crossovers. A preferred choice is to attach an interconnection substrate to substrate 32, with solder bump interconnections made from the interconnection substrate to pads 41. The interconnection substrate may be an intermediate interconnection substrate, or a translator substrate, as described and claimed in U.S. patent applications Ser. Nos. 09/149,803 and 09/149,804, both filed Sep. 8, 1998.

Figure 7:
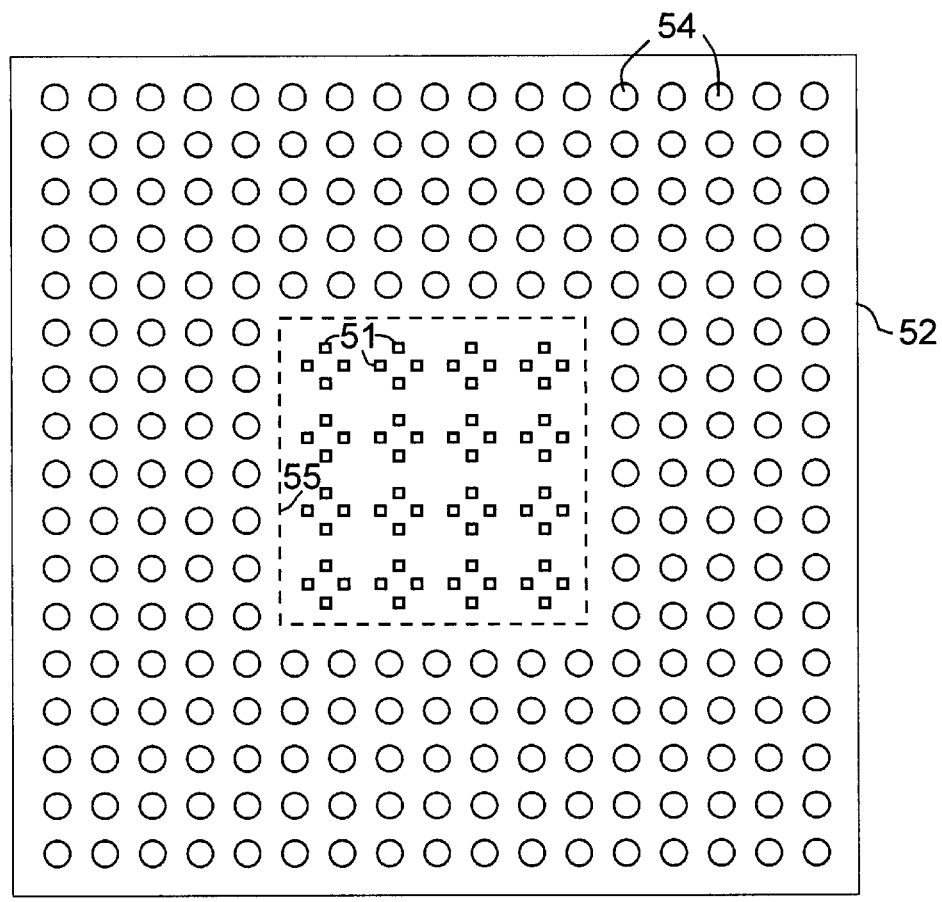
FIGS. 7–20 are representations of processing steps for constructing the interconnect system of the invention.

An example of an intermediate interconnection substrate for the micromechanical device array substrate 32 is shown in FIG. 7. An area array of bond pads, corresponding to the area array of pads 41 on substrate 32, is shown at 51, in the center region of translator substrate 52. The interconnection sites 41 and 51 are shown as square but may be round. FIG. 7 shows a only 64 substrate interconnection sites in the center region, but as indicated above, this number may be much larger than 64, which more closely represents the interconnection challenge that is addressed by this invention. The translator 52 can accommodate a much larger array.

The translator is used for the second interconnect level, i.e. the substrate to which the micromechanical device array chip is bonded, and may be constructed as a large module, optionally with multilevel interconnections, so that the large array of interconnections from the micromechanical device array chip can be accommodated and can cross over, re-route, and fan out. The added area outside the micromechanical device array chip area accommodates interconnection sites 54. These interconnection sites are for connections to the next board level. The size chosen for the translator depends on the number of area array interconnections required for the micromechanical device array and the pitch desired for these interconnections. In a typical arrangement the area of the translator is several times the area of the micromechanical device array chip.

With reference again to FIG. 7, the position of the IC chip, which may be flip-chip bonded to the translator, is shown at 55 in phantom. The array of interconnection sites in the center region of the translator mirrors the array on the micromechanical device array chip 32. The translator shown in FIG. 7 has an area approximately 7 times the area of the micromechanical device array chip. The added area outside the micromechanical device array chip area accommodates interconnection sites 54. These interconnection sites are for connections to the next board level.

Figure 8:
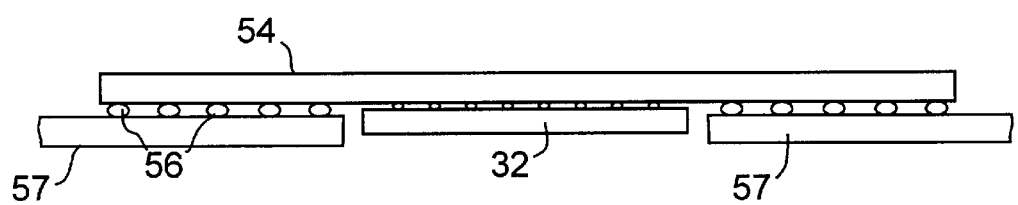

In the embodiment of FIG. 7 the translator has 320 interconnection sites, and, as indicated above, can accommodate a larger micromechanical device array than that illustrated here. However, it is evident that even in this illustration the interconnection pads 54 have substantially greater pitch than the pitch of the micromechanical device array chip pads 41. This allows the interconnections on the micromechanical device array chip to fan out to the next interconnection level. The translator can be flip-bonded to a printed wiring board or a ball grid array (BGA) using solder bumps or balls. The bump or ball pads at the interconnection sites 54 are typically solder wettable pads of e.g. Cu—Cr alloy or Ti—Pt—Au. This is shown in FIG. 8, where the micromechanical device substrate 32 is flip-chip bonded to the center region of translator 54, and the translator is then ball or bump soldered, by a series of interconnections 56, to the next board level 57. The interconnection to level 57 may comprise a ball grid array which provides reliable bonding of the many I/O leads from the translator to the next board level. The board level 57 may be an intermediate board level, or may be the system printed wiring board (PWB), i.e. the mother board. In either case an opening is provided in this level for the micromechanical device array chip. The opening serves both to reduce the package profile and to provide optical access to the micromechanical device array.

The material of the translator may be silicon, to match the coefficient of thermal expansion (CTE) of the IC chip. Another advantage of using silicon is that the interconnection technology for forming multiple levels of interconnections on the silicon is well known. Thus the multilevel interconnections can be made using $SiO_2$ for the interlevel dielectric and aluminum for the metallization as is standard in Si technology. Alternatively, ceramic may be used.

A preferred method for producing the interconnections shown in FIG. 6 will be described in conjunction with FIGS. 9–20.

Figure 9:
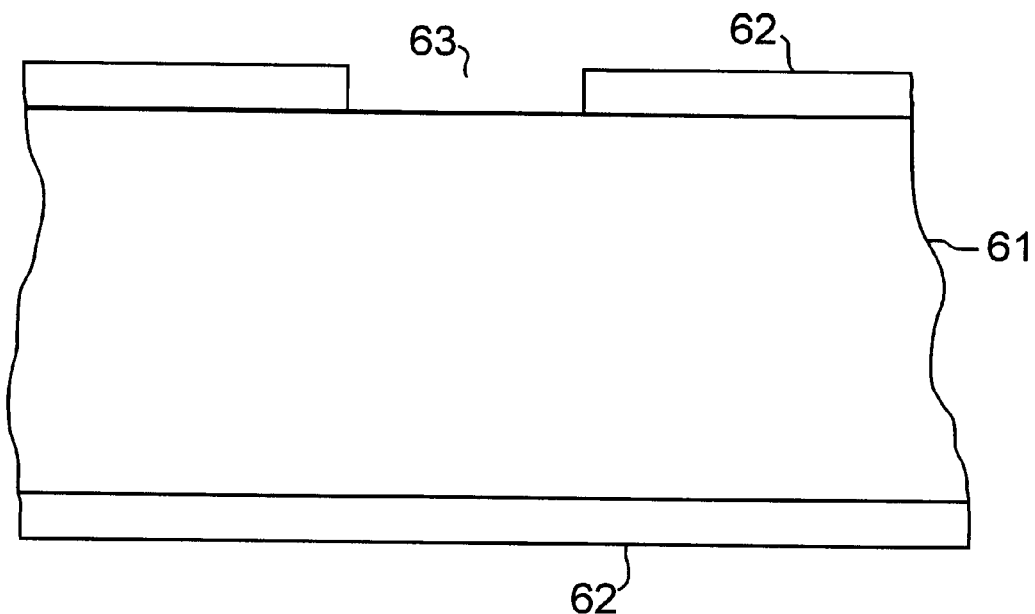

With reference to FIG. 9, the silicon micromechanical device array substrate is shown at 61. For this application the substrate thickness is of the order of 20 mils, but it should be understood that the substrate may be thinner or thicker. Typical silicon wafers have a thickness of 20–30 mils, and are frequently thinned using conventional thinning techniques 12 mils or less. For robust micromechanical device platforms, the preferred thickness is 15–30 mils. Referring again to FIG. 9, the substrate 61 is coated with a photoresist 62, and patterned using standard lithography, to leave mask feature 63. Feature 63 has a dimension corresponding to the width, preferably the diameter, of the through hole. The diameter of feature 63 in the embodiment described here is approximately 30 $\mu$m, within a recommended range of 10–50 $\mu$m. For the selective area processing described here the preferred lithography technique is photolithography, which is the practical choice for producing such large features. However, other lithography techniques such as electron beam or x-ray may be used.

Figure 10:
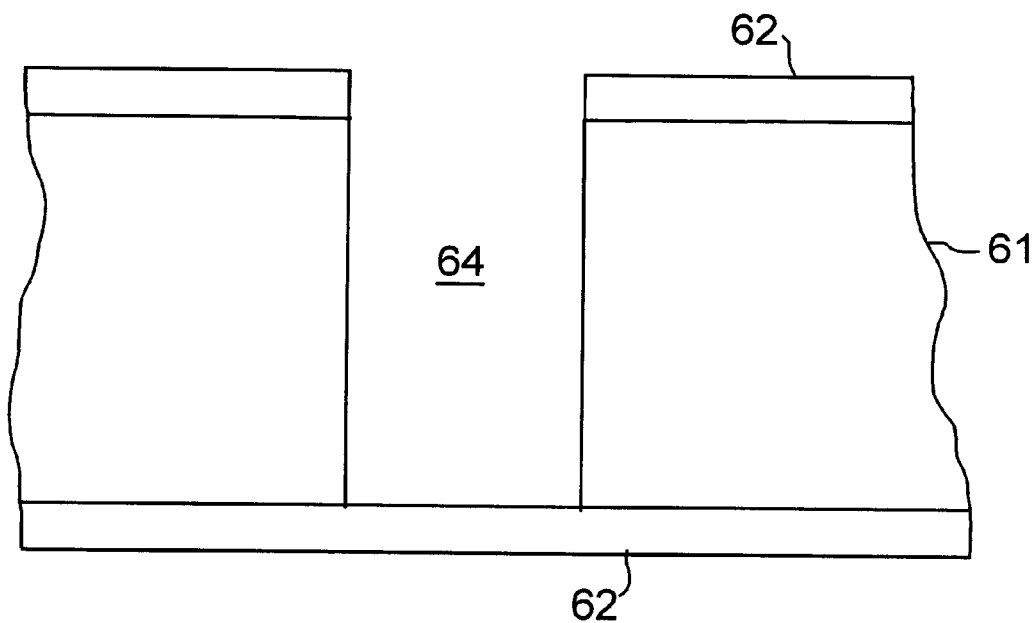

Using photoresist layer 62 as an etch mask, the wafer is exposed to a deep Reactive Ion Etch (RIE) to produce the structure shown in FIG. 10. As is well known, standard RIE etch processes produce openings with steep, essentially vertical, sidewalls as shown at 64 in FIG. 10.

Figure 11:
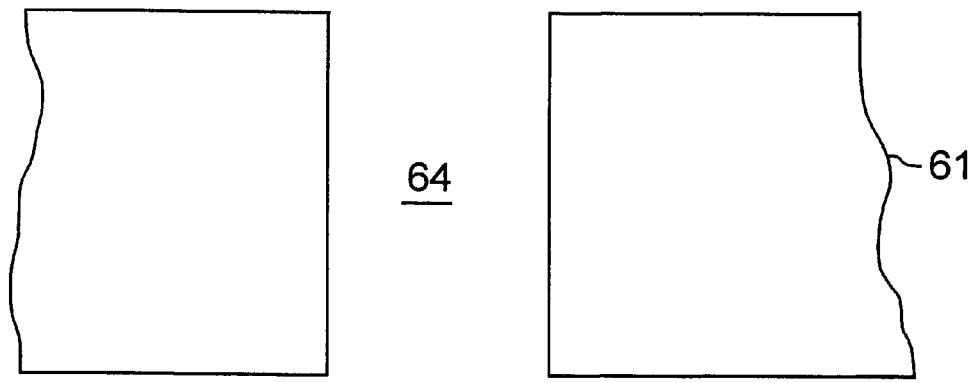
Figure 12:
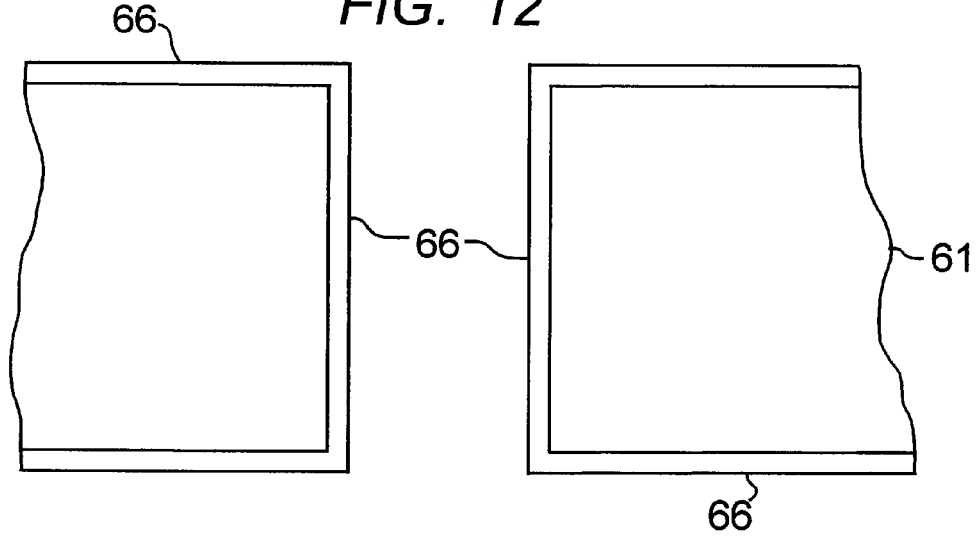

The mask is then stripped as represented by FIG. 11, and the wafer is oxidized to grow thermal oxide layer 66 on all exposed surfaces as shown in FIG. 12. The thickness of this layer is typically 1–3 $\mu$m, and serves simply to electrically isolate the opening from the substrate and other openings.

Figure 13:
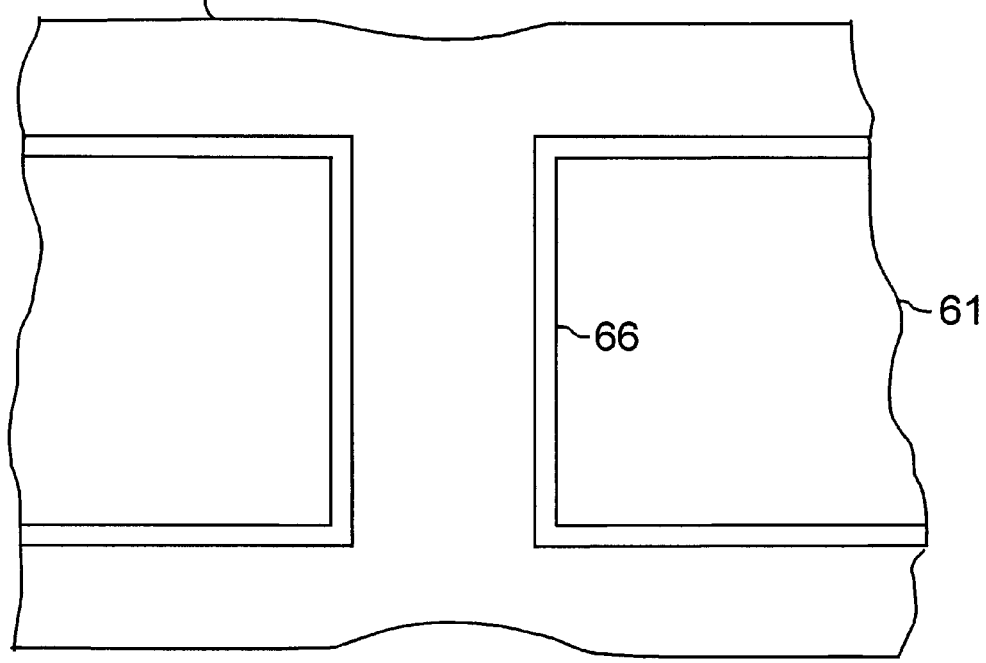
Figure 14:
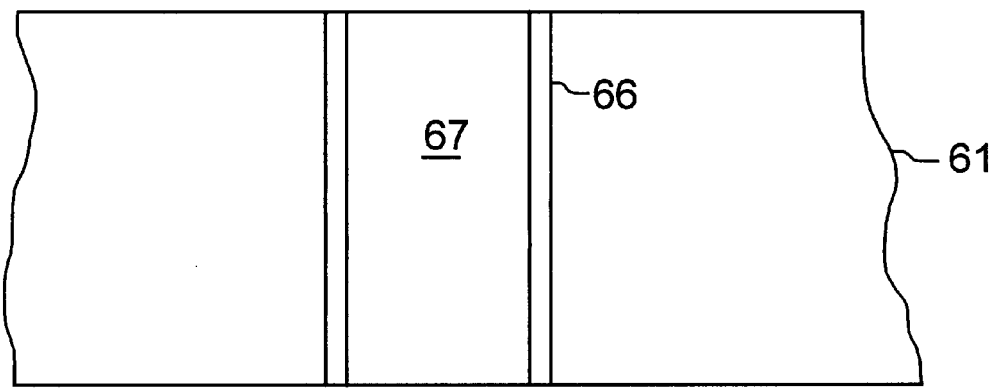

With reference to FIG. 13, LPCVD polysilicon (poly) 67 is deposited on the wafer and into the opening 64 to fully fill the opening. The poly layer is preferably degeneratively doped to function as a low resistance conductor. For complete filling of the via hole, the thickness of the poly layer is preferably greater than twice the radius of the via remaining after oxidation, and will typically be in the range 15–100 $\mu$m. The portion of the poly layer 67 that extends above the surface of substrate 61, and the surface portion of oxide layer 66, are removed by grinding or polishing using standard wafer thinning or chemical mechanical polishing (CMP) techniques. Both sides of substrate 61 are polished to produce the structure shown in FIG. 14. The thinning technique is non-critical and requires no stop layers. In the example given here, approximately 50 $\mu$m of material are removed from each surface. For convenience this operation, in whatever form used, is referred to as a planarizing step. It may be useful, in some processes, to partially remove the polysilicon fill layer during planarization, and pattern the remainder of this layer for interconnection.

Figure 15:
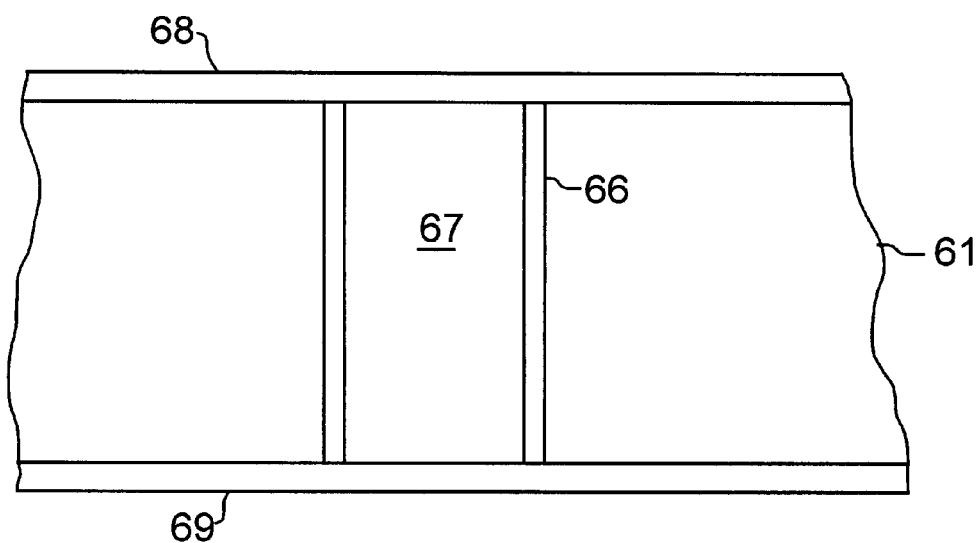
Figure 16:
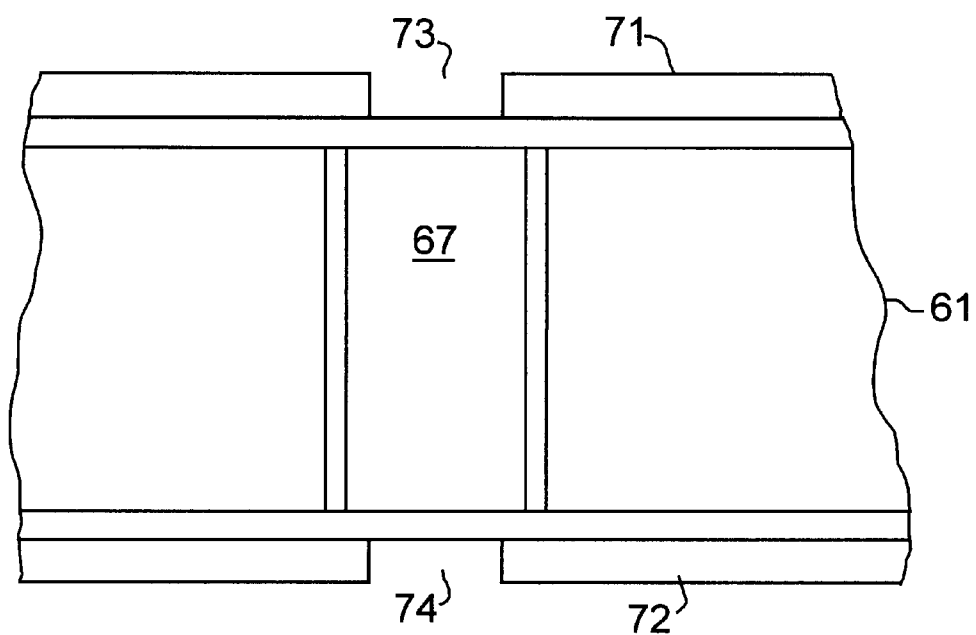
Figure 17:
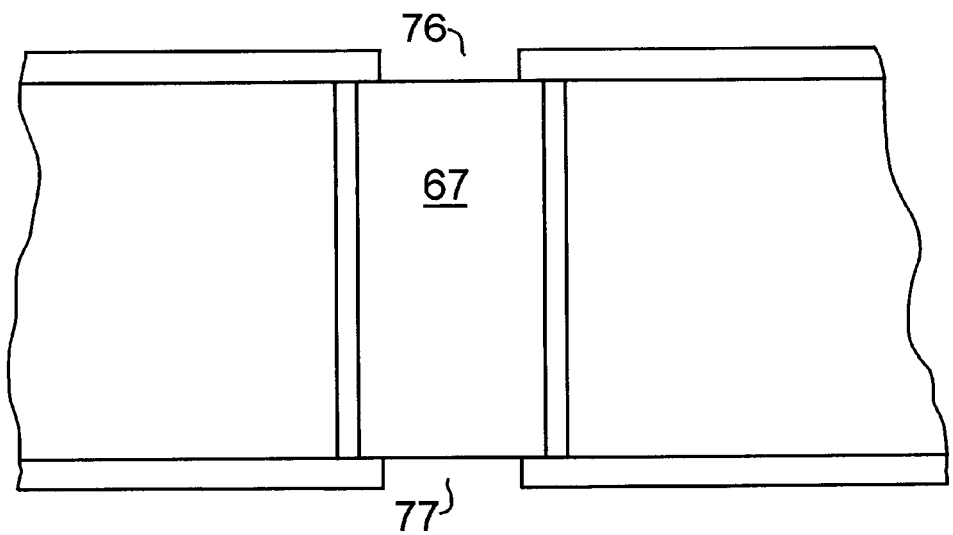

After the substrate planarizing step, a low temperature oxide deposition is performed to produce oxide surface layers 68 and 69 on the top and bottom surfaces respectively of the substrate, as shown in FIG. 15. The thickness of this oxide layer may be in the range 0.1 to 10 microns. The oxide layers 68 and 69 are then masked with photomasks 71 and 72 as shown in FIG. 16, with openings 73 and 74 exposing a portion of the poly fill 67. Mask features 73 and 74 have a diameter no greater than the diameter of poly fill to avoid shorting the contacts, to be deposited later, to substrate 61. The exposed portions of the oxide layers are etched, using a standard BOE wet etch, or using a dry etch e.g. RIE, to produce contact windows 76 and 77 as shown in FIG. 17.

Figure 18:
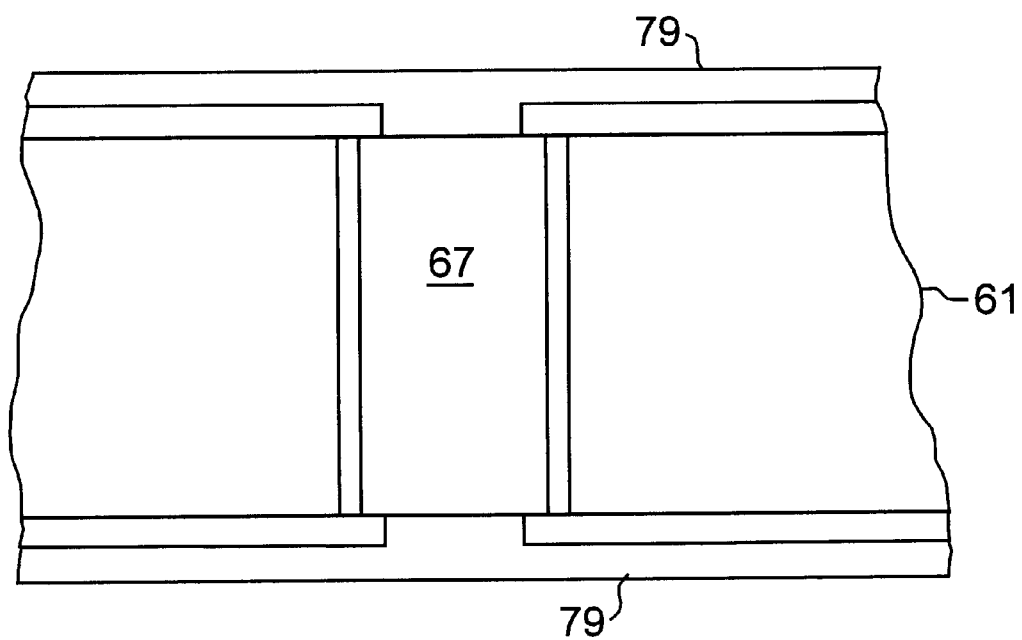
Figure 19:
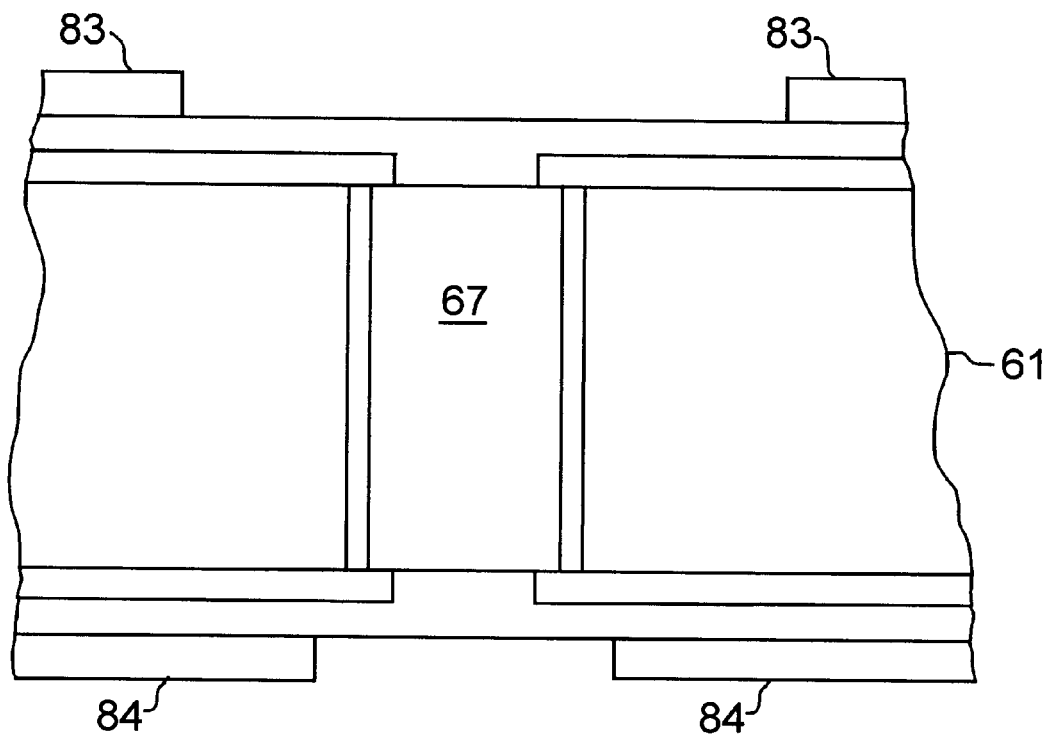

A contact layer 79, which may be any suitable contact material, e.g. 0.5–3.0 $\mu$m of aluminum, is deposited over the top and bottom of substrate 61 as shown in FIG. 18. The contact layer is masked with photomasks 83 and 84 as illustrated in FIG. 19, to define contacts which, after etching the contact layer and removing the photomask, appear at 86 and 87 in FIG. 20. Contact 86 corresponds to electrostatic electrode 34 (FIGS. 3, 4, 6), and contact 87 corresponds to electrode 41 (FIGS. 5, 6).

As an alternative, well known lift-off techniques can be used to produce the metallization for the contacts 86 and 87.

In the embodiments described above, a single micromechanical device array chip is shown. However, as will occur to those skilled in the art, substrate 52 of FIG. 7 may contain several or many flip-chip sites for micromechanical device array chips depending on the size of the assembly and the size of the various elements. The technique used for the flip-chip bond is not part of the invention and may e.g. be solder bump or ball bonding, or conductive epoxy etc. The substrate 52 may also comprise the final or system board level, with active control chips bonded to sites 54. In another desirable interconnection arrangement, the micromechanical device array chip is provided with an active control chip mounted on the backside of the silicon substrate in a chip-on-chip configuration.

Figure 20:
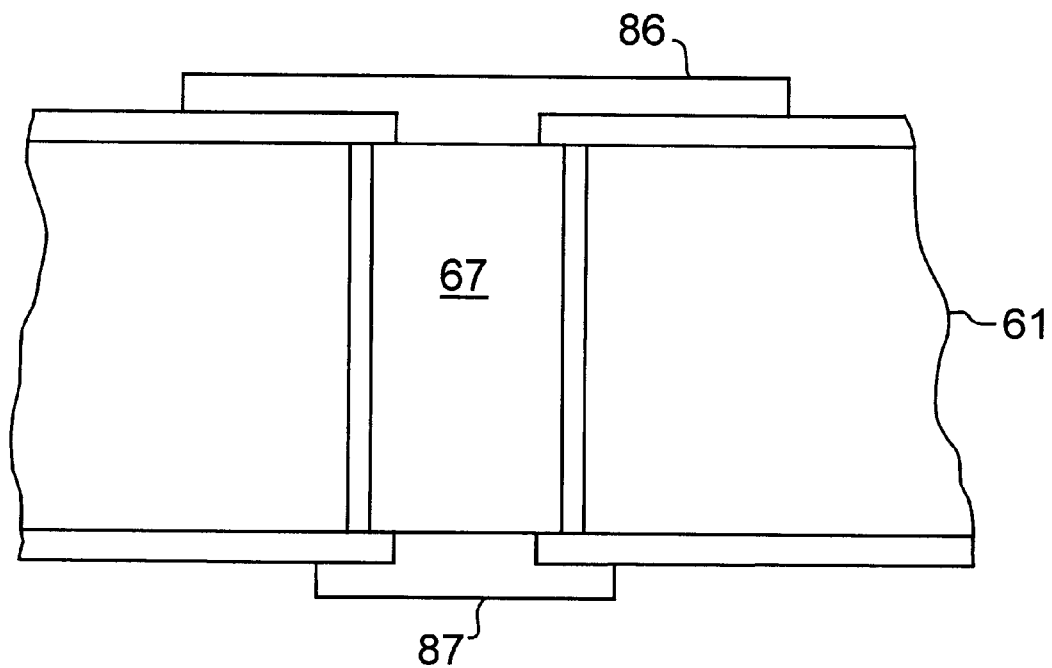

With the substrate processed to the stage represented by FIG. 20, the micromechanical device array is formed or mounted on the top surface of the substrate. For some device arrays, devices that are already essentially complete may be attached to the substrate. In other embodiments the device array may be formed, i.e. built, on the substrate. In either case, referred to generically as forming the device array on the top side of the substrate, electrical contacts associated with the device array are interconnected typically by printed circuit runners to the conductive vias on the top side of the substrate. An interconnection pattern, formed on the bottom side of the substrate, is interconnected to the bottom side of the vias.

In the embodiments described above, the micromechanical device array is formed on just one side of the substrate with the other side of the substrate comprising interconnection means. However, embodiments can be envisioned wherein micromechanical elements are provided on both sides of the substrate. Also, a logical extension of the invention described above would be to attach two substrates with micromechanical arrays as described in a chip-on-chip configuration. The chip-on-chip arrangement, in the case where the micromechanical array is optically active, i.e. has an optical input/output, should be configured to allow optical access to the device array.

It will also occur to those skilled in the art that while all the electrode interconnections in the embodiment shown in FIG. 3 are made through the substrate, a combination of top side and bottom side interconnections can easily be adapted to take advantage of the principles of the invention.

It should be understood that in the foregoing description of the process embodiments, and in the claims below, the process steps do not necessarily have to be performed in the sequence stated. However, normally the processing of the semiconductor substrate to form the vias will occur at the beginning. The printed circuit interconnections will normally be formed second, and the completion of the device array last. The printed circuits typically comprise electrical contacts on the top side of the substrate at the attachment sites for the device array, and an interconnection pattern, i.e. the runners in the printed circuit, for interconnecting the electrical contacts for the device array and the conductive vias. On the bottom side of the substrate the substrate interconnections will typically comprise runners from the conductive vias to interconnection pads for, for example, wire bond or solder bond interconnection to the next level. The next level may be a ceramic, epoxy or silicon interconnection substrate, or may be an IC chip as suggested earlier. The bond pads on the bottom of the substrate may be referred to as interlevel bond pads to include these various options. The bond pads for solder bump attachment will typically include under bump metallization.

Reference to CVD below is intended to include the various well known forms of chemical vapor deposition including LPCVD and PECVD. Reference to printed circuit below is intended to refer to metallization patterns, typically aluminum, formed by standard printed circuit techniques, either additive or subtractive.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. Method for the manufacture of a plurality of micromechanical devices comprising a micromechanical device array (MDA) in which the MDA is supported by a semiconductor substrate, the substrate having a top side and a bottom side, comprising the steps of:

(a) forming a plurality of conductive vias through the silicon substrate, the plurality of conductive vias formed by the steps of:
  i. masking the silicon substrate leaving openings for the conductive vias,
  ii. etching the silicon substrate in the openings by RIE to form holes extending completely through the silicon substrate, the holes having essentially vertical sidewalls,
  iii. oxidizing the silicon substrate to form an oxide layer on the sidewalls,
  iv. depositing polysilicon on the silicon substrate by chemical vapor deposition to completely fill the holes and deposit polysilicon on at least the top surface of the silicon substrate, and
  v. planarizing the top surface of the silicon substrate, leaving the plurality of conductive vias through the silicon substrate, (c) forming a bottom side printed circuit on the bottom side of the silicon substrate, the bottom side printed circuit comprising interlevel bond pads and runners interconnecting the interlevel bond pads with the plurality of conductive vias, (d) forming an MDA on the top side of the semiconductor substrate, and (e) forming conductive runners on the top side of the substrate interconnecting each of the micromechanical devices in the MDA with at least one of the plurality of conductive vias, and (f) providing means for input signals to the interlevel bond pads.

2. The method of claim 1 wherein the openings are circular with a diameter in the range 10–50 $\mu$m.

3. The method of claim 2 wherein the substrate has a thickness in the range 20–30 mils.

4. The method of claim 3 wherein the printed circuits comprise aluminum.

* * * * *